United States Patent
Chou et al.

(10) Patent No.: US 11,848,241 B2
(45) Date of Patent: *Dec. 19, 2023

(54) SEMICONDUCTOR STRUCTURE AND RELATED METHODS

(71) Applicant: Taiwan Semiconductor Manufacturing Company, Ltd., Hsinchu (TW)

(72) Inventors: Hung-Jiu Chou, Hsinchu (TW); Yuan-Ching Peng, Hsinchu (TW); Jiun-Ming Kuo, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/662,492

(22) Filed: May 9, 2022

(65) Prior Publication Data

US 2022/0262682 A1 Aug. 18, 2022

Related U.S. Application Data

(63) Continuation of application No. 16/947,196, filed on Jul. 22, 2020, now Pat. No. 11,328,959.

(51) Int. Cl.
*H01L 21/8234* (2006.01)
*H01L 21/02* (2006.01)
*H01L 29/66* (2006.01)
*H01L 21/8238* (2006.01)
(Continued)

(52) U.S. Cl.
CPC ........ *H01L 21/823431* (2013.01); *H01L 21/0245* (2013.01); *H01L 21/02293* (2013.01); *H01L 21/02299* (2013.01); *H01L 21/823412* (2013.01); *H01L 21/823821* (2013.01); *H01L 29/42392* (2013.01); *H01L 29/66795* (2013.01); *H01L 29/78696* (2013.01)

(58) Field of Classification Search
CPC ........ H01L 21/02293; H01L 21/02299; H01L 21/0245; H01L 21/02603; H01L 21/823412; H01L 21/823431; H01L 21/823807; H01L 21/823821; H01L 29/413; H01L 29/423; H01L 29/785; H01L 29/78696; H01L 29/42392; H01L 27/088; H01L 27/0886; H01L 29/0673; H01L 29/66439; H01L 29/66795; H01L 29/775; B82Y 10/00; B82Y 40/00
See application file for complete search history.

(56) References Cited

U.S. PATENT DOCUMENTS

| | | |
|---|---|---|
| 9,620,607 B2 | 4/2017 | Huang et al. |
| 2014/0175561 A1 | 6/2014 | Colinge et al. |
| 2015/0021663 A1 | 1/2015 | Akarvardar et al. |

(Continued)

*Primary Examiner* — Cheung Lee
(74) *Attorney, Agent, or Firm* — HAYNES AND BOONE, LLP

(57) ABSTRACT

Methods and associated devices including the fabrication of a semiconductor structure are described that include epitaxially growing a stack of layers alternating between a first composition and a second composition. The stack of layers extends across a first region and a second region of a semiconductor substrate. The stack of layers in the second region of the semiconductor substrate may be etched to form an opening. A passivation process is then performed that includes introducing chlorine to at least one surface of the opening. After performing the passivation process, an epitaxial liner layer is grown in the opening.

20 Claims, 12 Drawing Sheets

(51) Int. Cl.
*H01L 29/786* (2006.01)
*H01L 29/423* (2006.01)

(56) References Cited

U.S. PATENT DOCUMENTS

| | | |
|---|---|---|
| 2016/0035849 A1 | 2/2016 | Ching et al. |
| 2019/0189739 A1 | 6/2019 | Li et al. |
| 2020/0295198 A1 | 9/2020 | Cheng et al. |

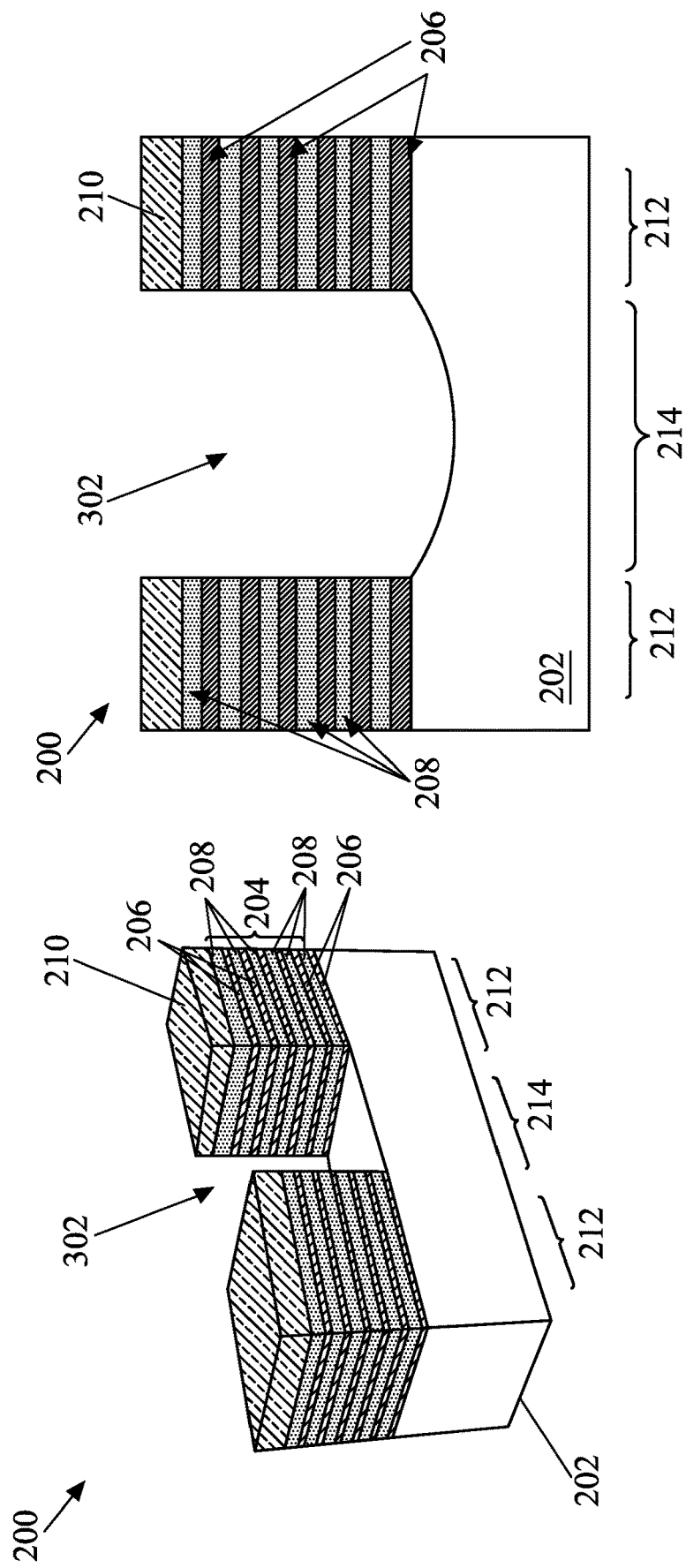

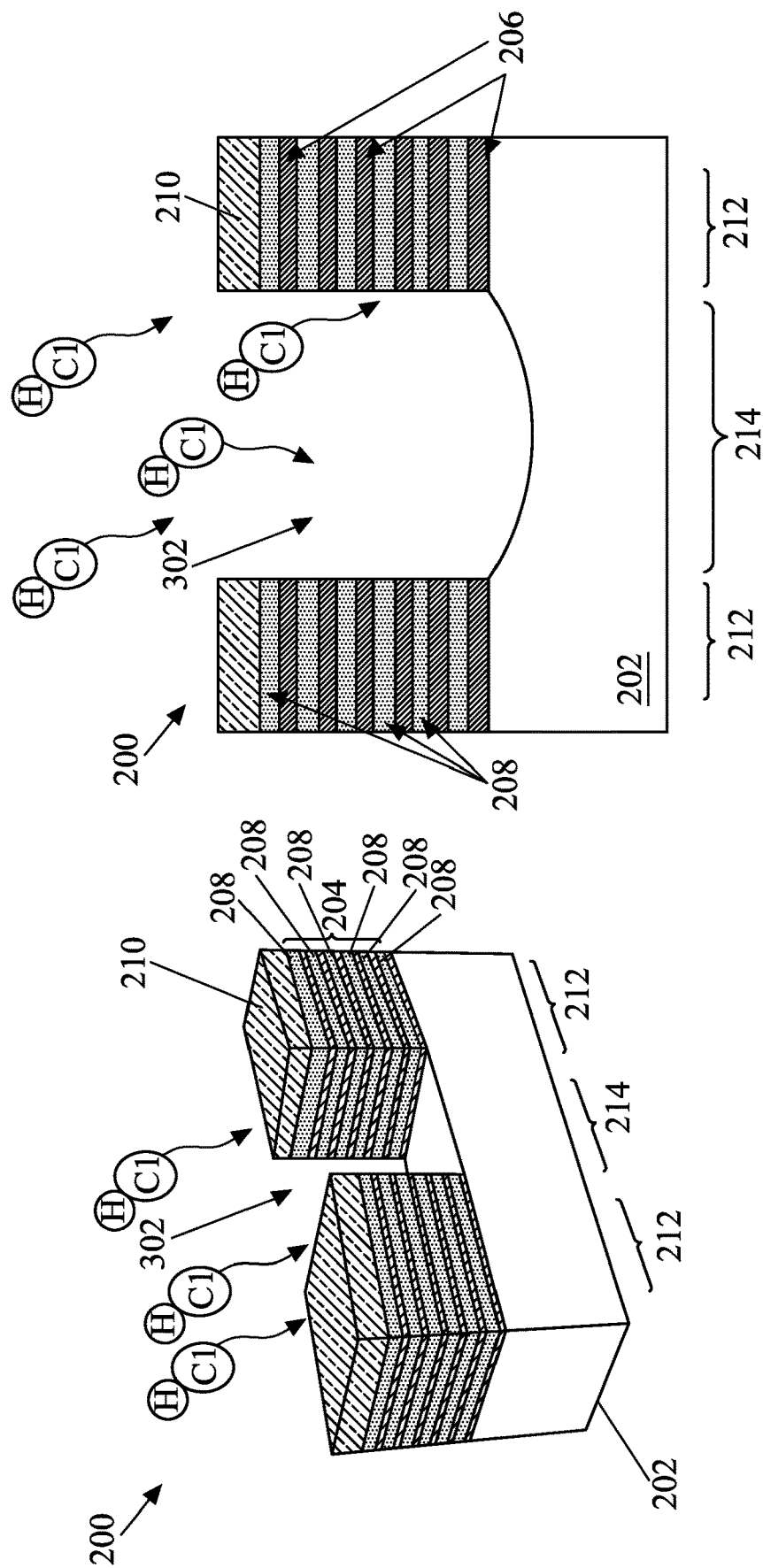

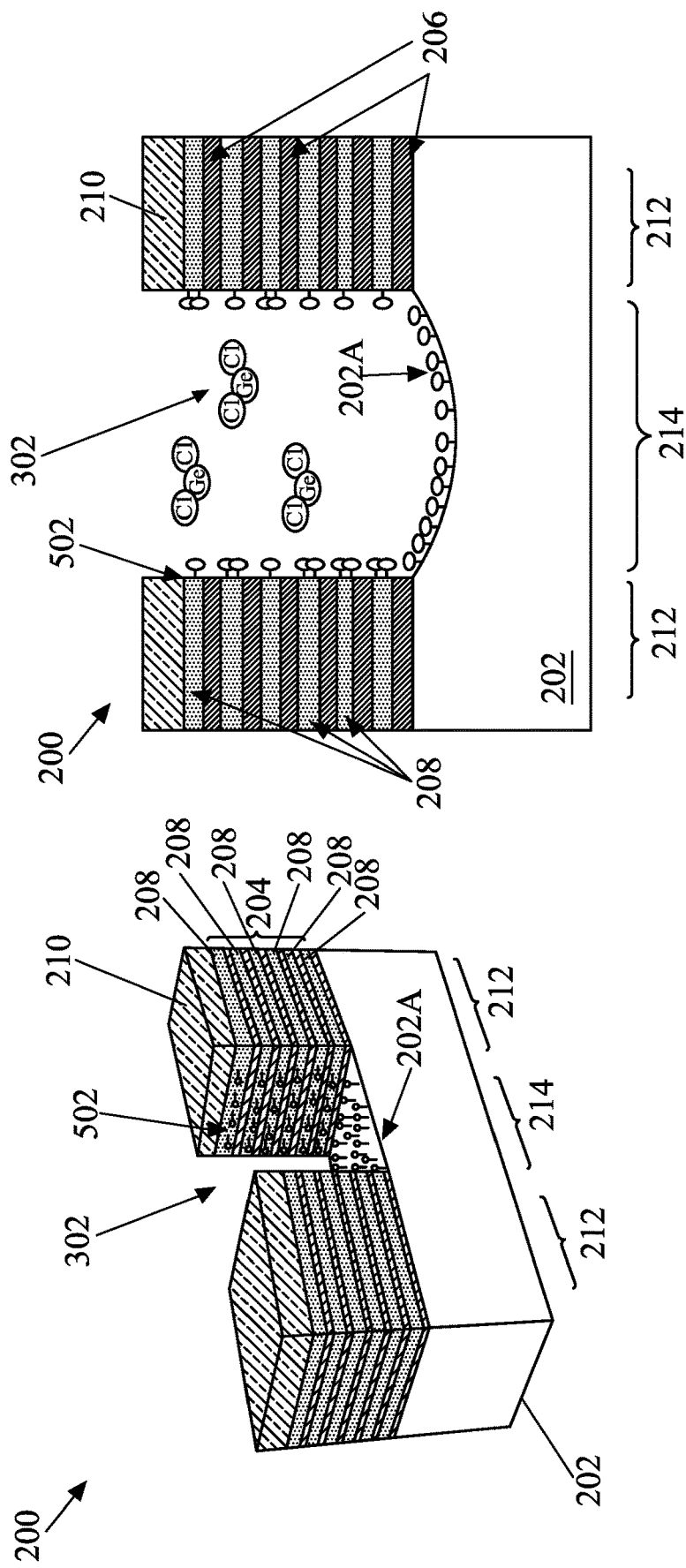

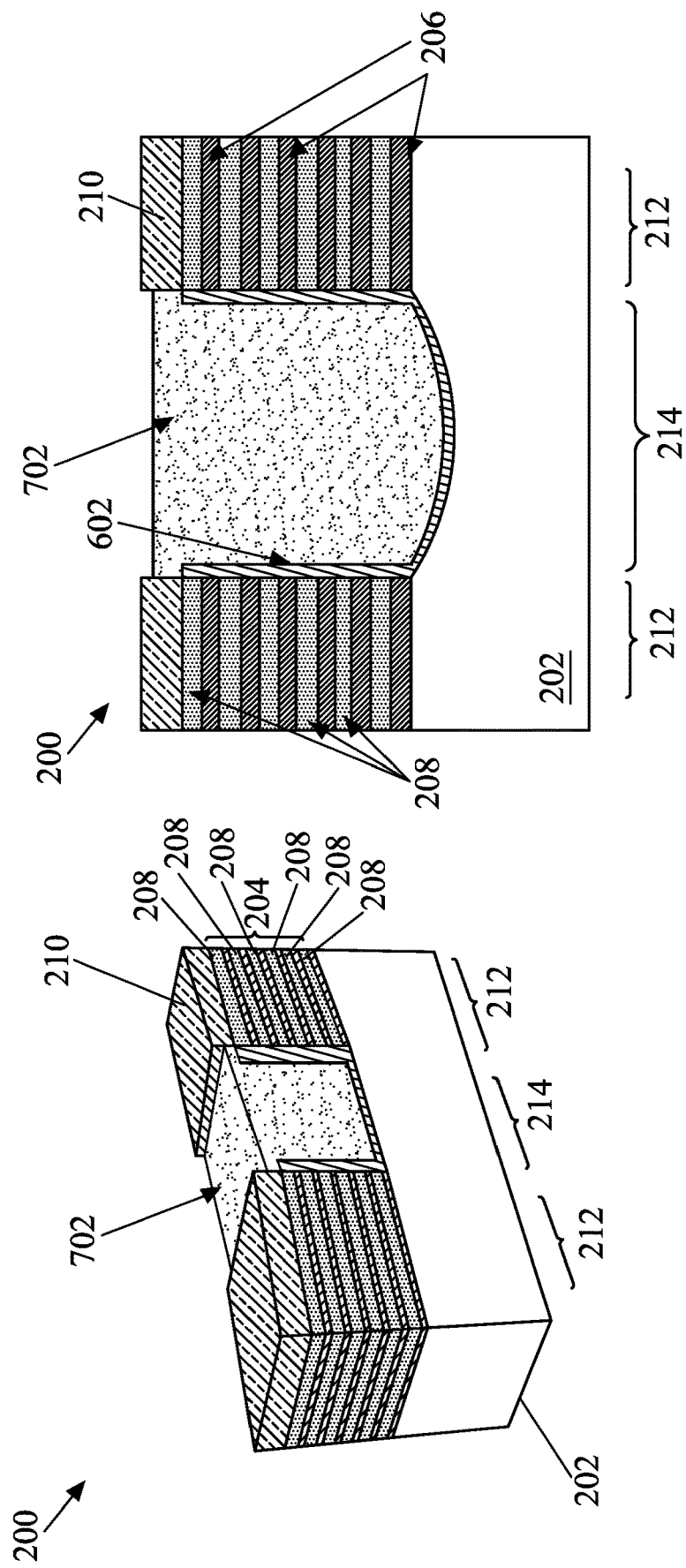

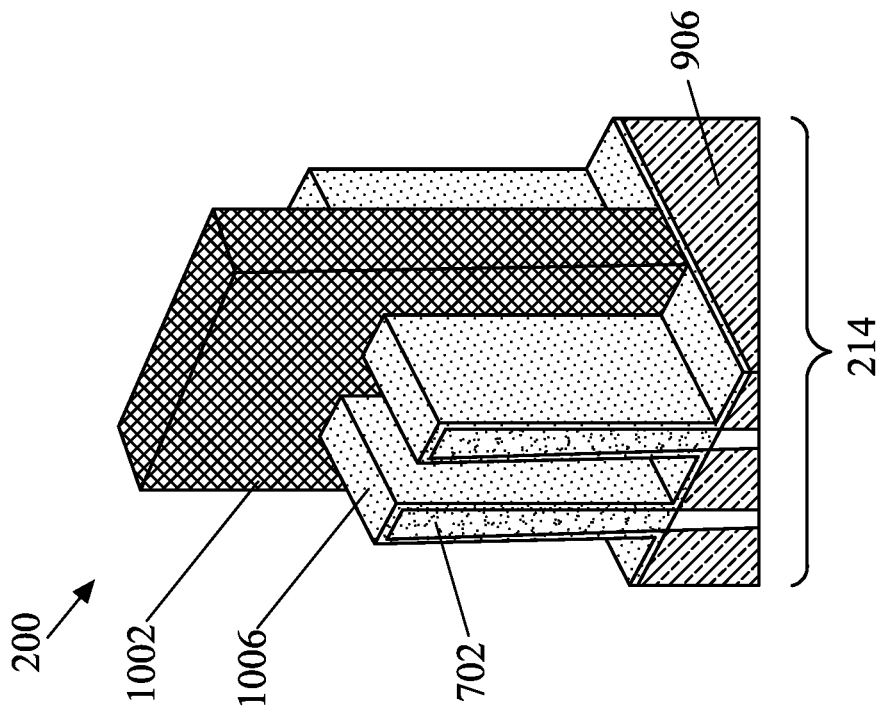
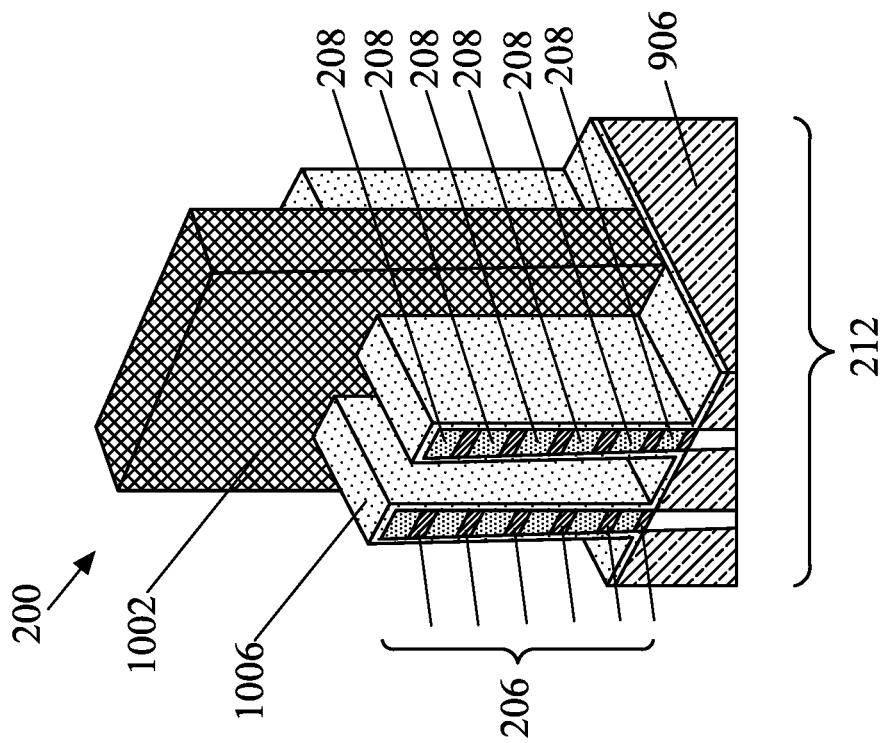

SEMICONDUCTOR STRUCTURE AND RELATED METHODS

CROSS REFERENCE TO RELATED APPLICATIONS

The present application is a continuation patent application of U.S. patent application Ser. No. 16/947,196, filed Jul. 22, 2020, issuing as U.S. Pat. No. 11,328,959, hereby incorporated by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

While planar transistors continue to fulfill technology needs for may device types, recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes such as those providing planar transistors and their three-dimensional structure allows them to be aggressively scaled while maintaining gate control and mitigating SCEs. In general, FinFET devices may be implemented when planar device performance can no longer meet performance requirements, and GAA devices may be implemented, for example, in cases where FinFETs can no longer meet performance requirements. Thus, it may be necessary to prepare a substrate for multiple device types. While existing techniques are present, they have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 9B, 10A, 10B, 11A, and 11B are isometric views of an embodiment of a semiconductor structure 200 according to aspects of the method of FIG. 1;

FIGS. 2B, 3B, 4B, 5B, 6B, 7B, and 8B are cross-sectional views of an embodiment of a semiconductor structure 200 according to aspects of the method of FIG. 1.

DETAILED DESCRIPTION

Figure 1:
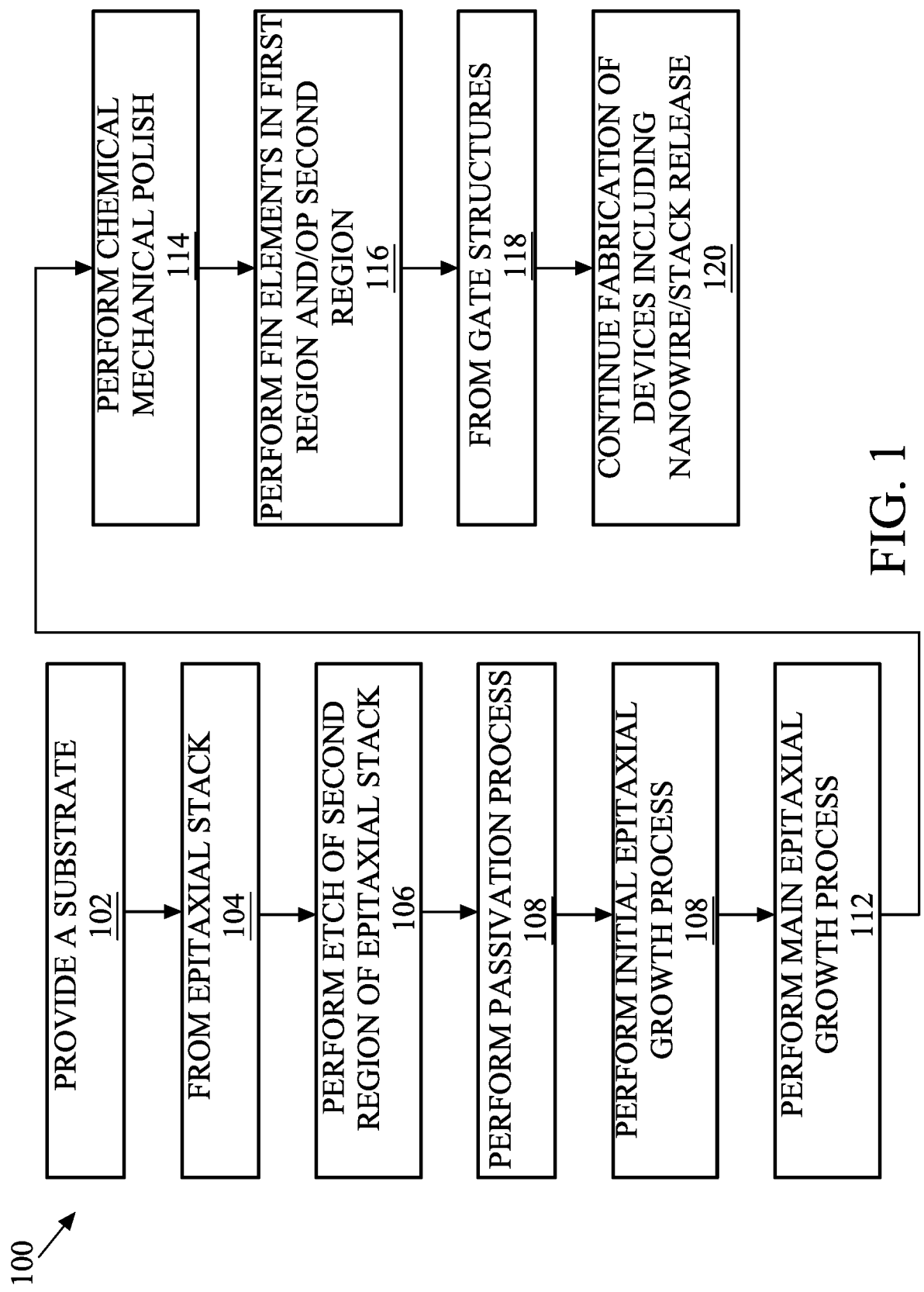
FIG. 1 is a flow chart of a method of fabricating a multi-gate device or portion provided according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents some devices of some embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FIN-FET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels.

One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. In accordance with embodiments of the present disclosure, a process flow and device structure are provided that include a nanowire or nanosheet devices, planar devices, and/or FinFET devices on a single substrate. As but one example, an N-type devices (NFETs) and a FinFET for P-type devices (PFETS) may be formed. To be sure, in some embodiments, PFET devices may include a nanowire or nanosheet device, and NFET devices may include FinFET devices. In some embodiments, both NFET and PFET devices may include nanowire or nanosheet devices, while other NFET and/or PFET devices with different performance requirements may include Fin-FET or planar devices. The present disclosure introduces devices and methods that prepare the substrate to define areas for forming these devices. In other words, the devices and methods herein provide for a region on a substrate where nanowire or nanosheet devices are formed, and a region on the substrate where FinFET (or planar, or other device type not requiring the nanowires of GAA) devices are formed. The methods here provide for an improvement of the composition of the layers formed on said substrate reducing unwanted species from certain regions of the substrate. Other embodiments and advantages will be evident to those skilled in the art upon reading the present disclosure.

Illustrated in FIG. 1 is a method 100 of semiconductor fabrication including fabrication of semiconductor structure. The method 100 may be used to form a semiconductor structure than includes a plurality of semiconductor devices including multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions. Additionally, in some examples, the multi-gate device may include a FinFET device, or a FinFET device formed in combination with a GAA device. It is understood that the method 100 includes steps having features of a complementary metal-oxide-semiconductor (CMOS) technology process flow and thus, are only described briefly herein. Additional steps may be performed before, after, and/or during the method 100.

FIGS. 2A, 3A, 4A, 5A, 6A, 7A, 8A, 9A, 9B, 10A, 10B, 11A, and 11B are isometric views of an embodiment of a semiconductor structure 200 according to various stages of the method 100 of FIG. 1. FIGS. 2B, 3B, 4B, 5B, 6B, 7B, and 8B are cross-sectional views, corresponding to respective isometric views listed above, of an embodiment of the semiconductor structure 200 along a first cut X-X' (see FIG. 2A). FIG. 12 is an embodiment of graphical representation corresponding to an embodiment of blocks of the method 100 of FIG. 1.

It is understood that parts of the semiconductor structure 200 may be fabricated by a CMOS technology process flow, and thus some processes are only briefly described herein. Further, the semiconductor structure 200 may include various other devices and features, such as other types of implanted regions, devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor structure 200 formed in the method 100 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art.

In an embodiment, the substrate 202 includes a first region 212 for devices of a first configuration and a second region 214 for devices of a second configuration. For example, in an embodiment, a first region 212 is designated for GAA transistors and a second region 214 is designated for FinFET transistors. In another embodiment, a first region 212 is designated for GAA transistors and a second region 214 is designated for planar transistors. While the exemplary figures show a single second region 214 and one or more first regions 212, it is noted that any number of first regions and second regions may be present on the substrate 202.

As stated above, the substrate 202 may be silicon. However, the substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

In an embodiment of the method 100, in block 102, an anti-punch through (APT) implant is performed. The APT implant may be performed in a region underlying the channel region of a device for example, to prevent punch-through or unwanted diffusion. In some embodiments, one or more APT implants may be performed, for example, for each of an N-type device region and a P-type device region.

Returning to FIG. 1, the method 100 then proceeds to block 104 where one or more epitaxial layers are grown on the substrate to form an epitaxial stack. In some embodiments, a hard mask is formed over the epitaxial stack. Continuing with reference to the example of FIG. 2, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are silicon germanium (SiGe) and the epitaxial layers 208 are silicon (Si). Thus, herein the layers will be referred to as SiGe layer 206 and Si layer 208. However, other embodiments are possible including those that provide for a first composition and a second composition having different oxidation rates and/or etch selectivity.

The silicon layers 208 or portions thereof in the first region 212 may form a channel region of a GAA transistor of the semiconductor structure 200. For example, the silicon layers 208 may be referred to as "nanowires" used to form a channel region of a GAA device, such as an N-type or P-type GAA device formed in the first region 212, including as discussed below. These "nanowires" are also used to form portions of the source/drain features of the GAA device, as discussed below. Again, as the term is used herein, "nanowires" refers to semiconductor layers that are cylindrical in shape as well as other configurations such as, bar-shaped. The interposing SiGe layers 206 may be subsequently removed in, for example, the channel region of the GAA in the first region 212. Thus, the SiGe layers 206 may serve to form a placeholder for the subsequently formed gate structure that wraps the Si layer 208 in the first region 212.

Figure 2B:
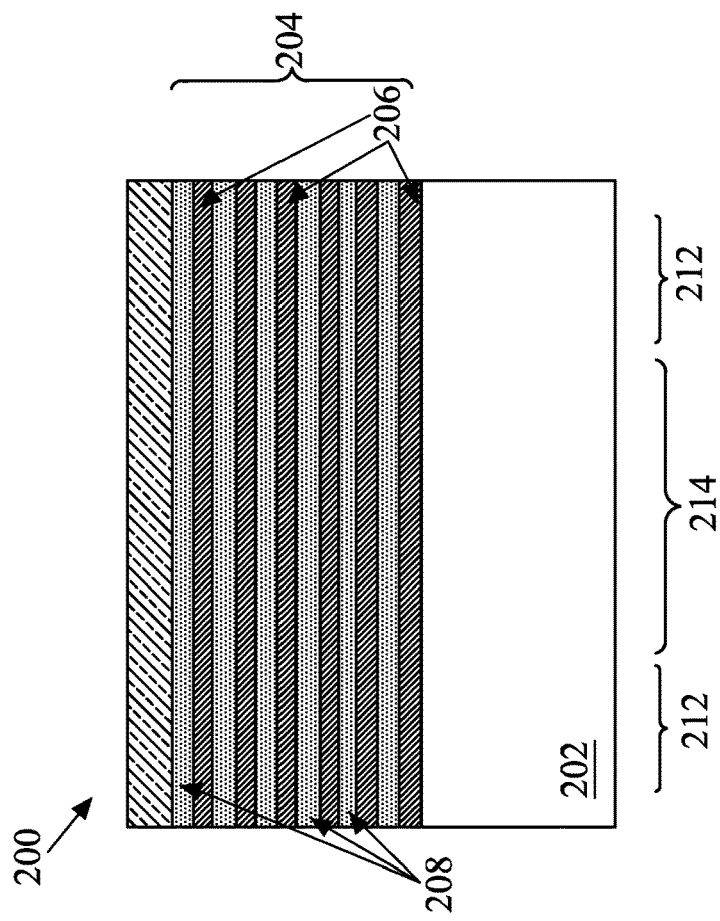
Figure 2A:
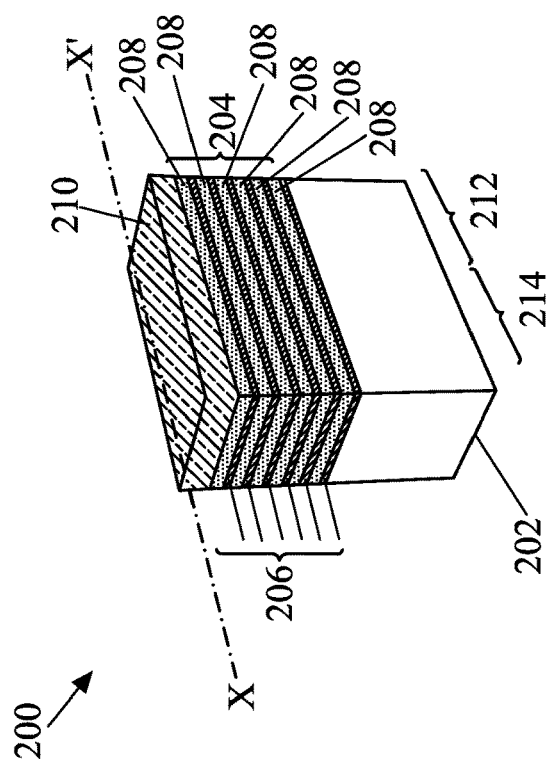
Figures 6A, 6B:
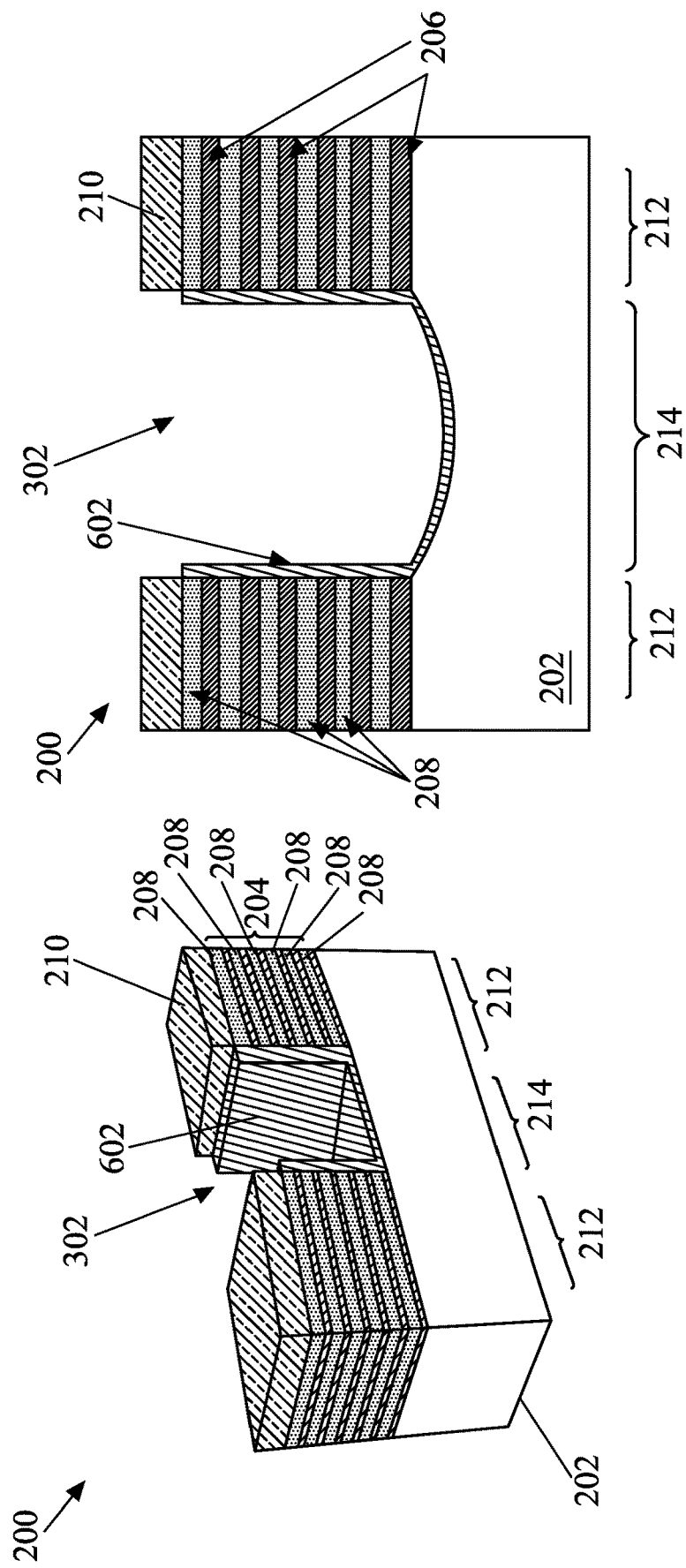
Figures 8A, 8B:
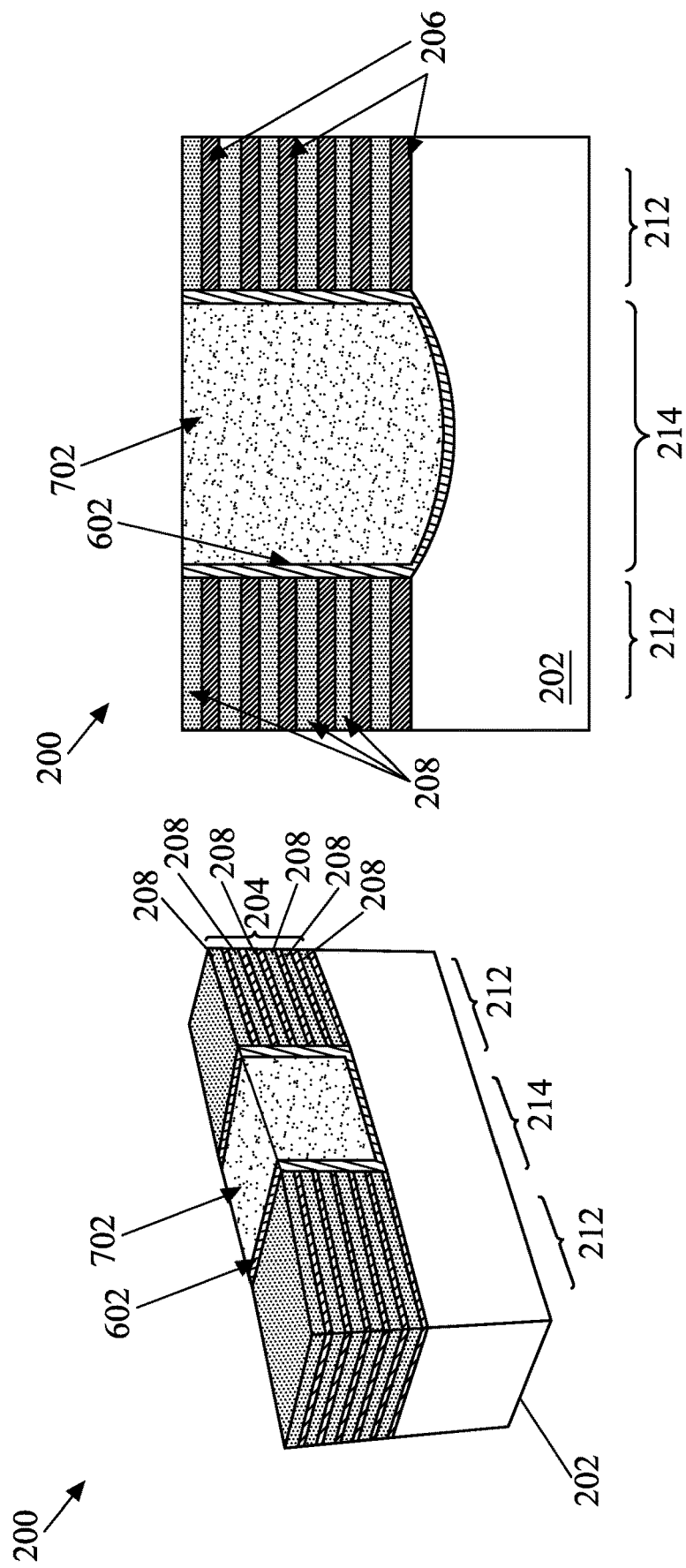

It is noted that six (6) layers of the SiGe layer 206 and six (6) layers of Si layer 208 are illustrated in FIG. 2A/2B, this is for illustrative purposes only and not intended to be limiting beyond what is specifically recited in the claims. It can be appreciated that any number of epitaxial layers can be formed in the epitaxial stack 204; the number of layers depending on the desired number of channel regions for the GAA device. In some embodiments, the number of Si layers 208 is between 4 and 10. While the uppermost layer of the stack 204 is illustrated as a Si layer 208, other configurations are possible.

In some embodiments, each of the SiGe layers 206 has a thickness range of about 4-8 nanometers (nm). In some embodiments, the SiGe layers 206 may be substantially uniform in thickness. In some cases, a topmost layer of the epitaxial stack 204 may be thicker than the remaining epitaxial layers (e.g., a top Si layer 208), for example, to mitigate layer loss that may occur to the topmost layer of the epitaxial stack 204 during a subsequent CMP process, as described below. In some embodiments, each of the Si layers 208 have a thickness range of about 5-8 nm. In some embodiments, the Si layers 208 of the stack are substantially uniform in thickness. In some embodiments, the Si layers 208 may serve as channel region(s) for a subsequently-formed multi-gate device (e.g., a GAA device) in first region 212 and its thickness chosen based on device performance considerations. The SiGe layers 206 may serve to define a gap distance between adjacent channel region(s) for the subsequently-formed multi-gate device and its thickness chosen based on device performance considerations.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the Si layers 208 include the same material as the substrate 202. In some embodiments, the epitaxially grown layers 206, 208 include a different material than the substrate 202. In various embodiments, the epitaxial layers—SiGe layer 206, Si layer 208—are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Still referring to FIGS. 2A/2B, in an embodiment of block 104, a hard mask (HM) layer 210 may be formed over the epitaxial stack 204. In some embodiments, the HM layer 210 includes an oxide layer (e.g., a pad oxide layer that may include $SiO_2$) and nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. By way of example, the oxide layer may have a thickness of between approximately 5 nm and approximately 40 nm. In some embodiments, the nitride layer may have a thickness of between approximately 20 nm and approximately 160 nm. The HM layer 210 may be used as a masking element for the subsequent patterning steps discussed below.

It is noted that at block 102 and the examples of FIGS. 2A/2B, the epitaxial stack 204 may be formed across the substrate 202. For example, in some embodiments, the epitaxial stack 204 is formed across the semiconductor wafer.

The method 100 then proceeds to block 106 where an etch process of the second region of the substrate is performed. Block 106 may include a photolithography process in order to define the second region of the substrate and protect the first region of the substrate from the etching. Again, in an embodiment, the second region of the substrate is defined as a region where non-GAA transistors are (e.g., planar or FinFETs) are to be formed. Referring to the example of FIGS. 3A/B, an embodiment of block 106 is shown. In some embodiments, a photolithography (photo) step is performed to form a patterned photoresist (resist) layer that exposes the second region 214. For example, in some embodiments, performing the photo step may include forming a resist layer over the semiconductor structure 200, exposing the resist to a pattern (e.g., first region masked), performing post-exposure bake processes, and developing the resist to form a patterned resist layer. In some embodiments, after formation of the patterned resist layer, an etching process is performed to etch the HM layer 210 and the epitaxial stack 204 within the second region 214, while the first region 212 remains masked by the patterned resist layer and/or HM layer 210. In some examples, the etching process may include a wet etch, a dry etch, or a combination thereof. In addition, in some embodiments, one or more different etch chemistries may be used to effectively etch each of the HM layer 210 and the epitaxial layers 206, 208 of the epitaxial stack 204. The etch removal of the epitaxial stack 204 in the second region 214 forms opening 302 in second region 214. In an embodiment, a first dry etching process (e.g., As-etch, fluorocarbon etch) is performed to form the opening 302 and a second wet clean is performed after the first dry etching. In some examples, the etching process may proceed until a surface of the underlying substrate 202 within the second region 214 is exposed. After the etching process, the resist layer may be removed, for example, by way of a solvent, resist stripper, ashing, or other suitable technique.

The method 100 then proceeds to block 108 where a passivation process is performed. The passivation process may mitigate the diffusion of unwanted species to certain regions on the sidewalls and bottom of the opening provided in block 106. In an embodiment, the passivation process inhibits the diffusion of germanium (Ge) from the silicon germanium layers 206 to the silicon layers 208 and/or the exposed surface of the substrate 202. The passivation process may include introducing hydrochloric acid (HCl) to the substrate (e.g., in vapor form) including within the opening provided by the etching of block 106. In some embodiments, $H_2$ carrier gas may be introduced along with HCl. The HCl may provide for passivation of the sidewalls of the opening formed by the etching of block 106 as discussed below.

The passivation of the sidewalls of the opening and/or the expose substrate surface is provided by reducing the dangling bonds at the surface(s). Specifically, in some embodiments, the composition of the Si layers 208 and the exposed substrate 202 are silicon that on etching results in dangling bonds. These dangling bonds, if left unmitigated, can attract Ge if the Ge diffuses from adjacent SiGe layers 206 (e.g., at an elevated temperature). Thus, the passivation process prevents or mitigates Ge diffusion from the SiGe layer 206 to the Si layer 208 and the top surface of the substrate 202. While not being confined to any specific theory, the details of a mechanism the passivation process is discussed in further detail below.

With reference to the example of FIGS. 4A/4B, in an embodiment of block 108, the passivation process introduces HCl species over the substrate 202 within the second region 214 in the opening 302. The HCl species may be introduced as a gas in a chamber also providing an epitaxial process (such as discussed below with reference to block 110 and/or 112 such as MBE process, an MOCVD process, and/or other suitable epitaxial growth processes).

The temperature of the passivation process of block 108 may increase during the duration of the process (e.g., during the providing of HCl) until the chamber/substrate reaches a temperature suitable for the performance of block 110. In an embodiment, the temperature may increase during the passivation process by approximately 35-60%. In an embodiment, the temperature of the passivation process may be between approximately 325 Celsius and 650 Celsius.

While the chlorine source is provided by HCl in the described above, one would recognize other chlorine sources may be possible. In another embodiment of the method 100, block 108 is omitted. For example, after etching of the opening, the epitaxial liner layer of block 110 discussed below is grown.

In an embodiment, the passivation of the sidewalls of the opening 302 and/or the bottom surface of the opening 302 is provided by the introduction of HCl and in particular the chlorine atoms. The chlorine atoms can attach to the dangling bonds available on the silicon material of the Si layers 208 and/or the bottom surface of the opening, the exposed surface of the substrate 202. This makes the bonding sites unavailable for germanium bonding when future high temperature processes cause the germanium in SiGe to dissociate and diffuse. With reference to the FIGS. 5A/5B, passivated to treated sidewalls 502 and treated substrate surface 202A are illustrated. Treated sidewalls 502 and substrate surface 202A include chlorine (Cl) having bonded onto the dangling bonds of the silicon layers 208. Germanium (Ge), rather that diffuse to the silicon layers 208, may be captured by the chlorine (Cl) and removed from the chamber as outgas product. In some embodiments, the Ge diffusion increases with a ramping temperature and thus, providing the passivation of block 108 prior to the epitaxial growth processes of block 110 and/or block 112 at increased temperatures may advantageously limit the Ge diffusion during temperature ramping.

In some embodiments, the passivation process of block 108 may be performed in-situ with block 110. The transition between block 108 and block 110 is discussed in detail below, which includes a period of time where the chlorine source and a silicon source are both introduced into the chamber.

In an embodiment, the pressure of the passivation process of block 108 is substantially similar to the pressure of the epitaxial growth of block 110. In an embodiment, the pressure may be between approximately 75 Torr and approximately 350 Torr. In a further embodiment, the pressure is between approximately 275 and 325 Torr. In an embodiment, the pressure is tuned to provide appropriate limitation of reflow of the SiGe layers 206.

In some embodiments, the passivation process of block 108 in addition to forming the sidewalls 502 of the opening 302 that have passivated edges of the Si layers 208, also slightly etches the sidewalls of the SiGe layers 206. The etching of the sidewalls of SiGe layers 206 may be one source of the germanium that is provided in the outgassed product (e.g., $GeCl_2$).

The method 100 then proceeds to block 110 where an initial epitaxial growth process forming an epitaxial liner layer is performed. The epitaxial liner layer is formed on the substrate in the second region and in particular, in the opening provided by the etching of second region in block 106. In an embodiment, block 110 follows block 108. In another embodiment, block 108 is omitted and block 110 follows the etching of block 106. In yet another embodiment, block 110 is omitted and the method 100 proceeds to block 112. With reference to the example of FIGS. 6A/6B, in an embodiment of block 110, an epitaxial liner layer 602 is formed over the substrate 202 within the second region 214 in the opening 302. In an embodiment, the epitaxial liner layer 602 is formed on the treated sidewalls 502 and substrate surface 202A defining the opening 302. In some embodiments, the epitaxial liner layer 602 includes silicon (Si); however, other embodiments are possible. In an embodiment, the silicon (Si) of epitaxial liner layer 602 is not purposefully doped.

In an embodiment, epitaxial growth of the epitaxial liner layer 602 may be performed by an MBE process, an MOCVD process, and/or other suitable epitaxial growth processes. In some embodiments, the epitaxial growth of the epitaxial liner layer 602 is performed in-situ with the passivation process of block 108. In some embodiments, the epitaxial liner layer 602 may include the same material as the substrate 202. In some embodiments, the epitaxial liner layer 602 may include a different material than the substrate 202. As stated above, in at least some examples, the epitaxial liner layer 602 includes an epitaxially grown silicon (Si). In various embodiments, the epitaxial liner layer 602 is substantially dopant-free (i.e., having an extrinsic dopant concentration from about 0 $cm^{-3}$ to about $1\times10^{17}$ $cm^{-3}$), where for example, no intentional doping is performed during the epitaxial growth process.

In an embodiment, the process temperature of block 110 is less than that of the growth of block 112, discussed below. In an embodiment, the temperature of the growth of block 110 is between approximately 500 and 650 degrees Celsius. FIG. 12 is illustrative of the process temperature of forming the epitaxial layer liner with respect to the temperature ramping during the passivation process of block 108. In an embodiment, the pressure of the process of block 110 is substantially similar to the pressure of block 108. In an embodiment, the pressure may be between approximately 75 Torr and approximately 350 Torr. In a further embodiment, the pressure is between approximately 275 and 325 Torr. In an embodiment, the pressure is tuned to provide appropriate limitation of reflow of the SiGe layers 206.

In an embodiment, the passivation of the sidewalls 502 means that germanium from SiGe layers 206 neighboring the Si layers 208 cannot attach to the Si layers 208 because the surfaces have been passivated with Cl (e.g., dangling bonds filled with Cl) as described above and as illustrated in FIGS. 5A/5B.

In an embodiment, the temperature of block 110 is sufficient to provide the desorption of chlorine (e.g., breaking of $SiCl_2$) from the passivated sidewalls 502, desorption of any chlorine from surfaces including Ge (e.g., $GeCl_2$), and/or desorption of $H_2$ from Si or Ge materials on the sidewalls of the opening 302. The desorption peak of $SiCl_2$ from Si may be the highest temperature, and thus, this temperature may be a minimum temperature required for block 110 to remove the species (e.g., prior to the epitaxial liner growth). Thus, in an embodiment, the temperature of the epitaxial growth process of block 110 is approximately equal to or greater than approximately 586 Celsius, the desorption peak temperature for $SiCl_2$ from Si.

In an embodiment, the formation of the epitaxial liner layer 602 includes introducing a reactive gas of dicholorosilane (DCS) $H_2SiCl_2$ to form a silicon epitaxial liner layer 602. While DCS is one silicon source, in other embodiments, other silicon precursors may be used in addition to or instead of DCS. In an embodiment, the processes of block 108 and 110 are performed in-situ and the reactive gas is changed from HCl in the passivation process of block 108 to the reactive gas of DCS in the epitaxial growth of the block 110. However, it is noted that a transition period between blocks 108 and 110 may be provided.

The transition period between blocks 108 and 110 include a co-flow of the chlorine source and the silicon source. In an embodiment, the chlorine source, HCl reactive gas, during the transition period has a ratio to the silicon source, DCS, of approximately 1 volume unit of HCl to approximately 8 volume units (e.g., standard cubic centimeters per minute (sccm)) of DCS for a period of time defined as the transition period. This may be referred to as a co-flow of HCl and the silicon precursor (e.g., DCS) during the transition period. In an embodiment, the volume of DCS gas in the transition period is substantially the same as the volume of DCS during the epitaxial growth process of block 110. The transition period may be performed at the same temperature as block 110 (i.e., the transition period may be performed after the temperature ramp of block 108 illustrated in FIG. 12). In an embodiment, a carrier gas of $H_2$ is used throughout block 108 and 110 including the transition period. FIG. 12 denotes the transition period with a T.

After the transition period, the flow rate of the silicon precursor (e.g., DCS) may be maintained for the epitaxial liner growth 602 in block 110. In an embodiment, the flow rate of the silicon precursor may be between approximately 300 and 500 sccm for growing the epitaxial liner layer.

In an embodiment, the epitaxial liner layer 602 may be between 1 and 10 nanometers (nm). In a further embodiment, the epitaxial liner layer 602 may be between 1 and 5 nanometers (nm). In a further embodiment, the epitaxial liner layer 602 may be between approximately 1 and 2 nm.

The method 100 then proceeds to block 112 where an epitaxial layer is grown on the substrate in the second region. With reference to the example of FIGS. 7A/7B, in an embodiment of block 112, an epitaxial layer 702 is formed over the substrate 202 within the second region 214 in the remaining opening 302. In some embodiments, the epitaxial layer 702 includes silicon (Si); however, other embodiments are possible. In an embodiment, the silicon (Si) of epitaxial layer 702 is not purposefully doped. The epitaxial layer 702 or portions thereof may form a channel region of a FinFET device of the semiconductor structure 200. For example, the epitaxial layer 702 may be used to form a channel region of a FinFET device formed in the second region 214, as discussed below. The epitaxial layer 702 or portions thereof may form a channel region of a planar transistor device of the semiconductor structure 200.

In an embodiment, epitaxial growth of the epitaxial layer 702 may be performed by an MBE process, an MOCVD process, and/or other suitable epitaxial growth processes. In some embodiments, the epitaxial growth of the epitaxial layer 702 is performed in-situ with the growth of epitaxial liner layer 602. In some embodiments, the epitaxial layer 702 may include the same material as the substrate 202 and/or the epitaxial liner layer 602. In some embodiments, the epitaxial layer 702 may include a different material than the substrate 202. As stated above, in at least some examples, the epitaxial layer 702 includes an epitaxially grown silicon (Si). Alternatively, in some embodiments, the epitaxial layer 702 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In various embodiments, the epitaxial layer 702 is substantially dopant-free (i.e., having an extrinsic dopant concentration from about 0 $cm^{-3}$ to about $1 \times 10^{17}$ $cm^3$), where for example, no intentional doping is performed during the epitaxial growth process. In other embodiments, the epitaxial layer 702 or portions thereof may be doped through in-situ doping or later implantation. In an embodiment, the epitaxial layer 702 is the same composition as the epitaxial liner layer 602. In further embodiment, this same composition is silicon.

In an embodiment, the process temperature of block 112 is greater than that of the growth of block 110. In an embodiment, the temperature of the growth of block 112 is about 20 to 45% greater than the temperature of block 110. In an embodiment, the first temperature is between approximately 500 and 650 degrees Celsius and the second temperature is between approximately 675 and 850 degrees Celsius. FIG. 12 is illustrative of the increase in process temperature between the growth of block 110 and the growth of block 112. In an embodiment, the process pressure (ton) of block 112 is less than that of the growth of block 110. In an embodiment, the pressure may be decreased during and/or after (e.g., ramped down in ton) the epitaxial growth of block 110 and the epitaxial growth of block 112. In an embodiment, the pressure of block 112 may be decreased approximately to, approximately 2 to 10% of the pressure of block 110. For example, in an embodiment, the pressure of block 112 is decreased to approximately 5-25 torr, in an embodiment. While FIG. 12 illustrates a stair-step increase the temperature of block 112, in other embodiments, during block 110 the temperature may gradually increase (e.g., during a second half of the epitaxial liner layer growth).

The method 100 proceeds to block 114 where a chemical mechanical polishing (CMP) process is performed. With reference to the example of FIGS. 8A/8B, in an embodiment of block 114, a CMP process is performed. In some embodiments, the CMP process removes the HM layer 210 from the first region 212 and planarizes a top surface of the semiconductor structure 200. The CMP process may remove a top portion of the epitaxial layer 702.

Figure 9A:
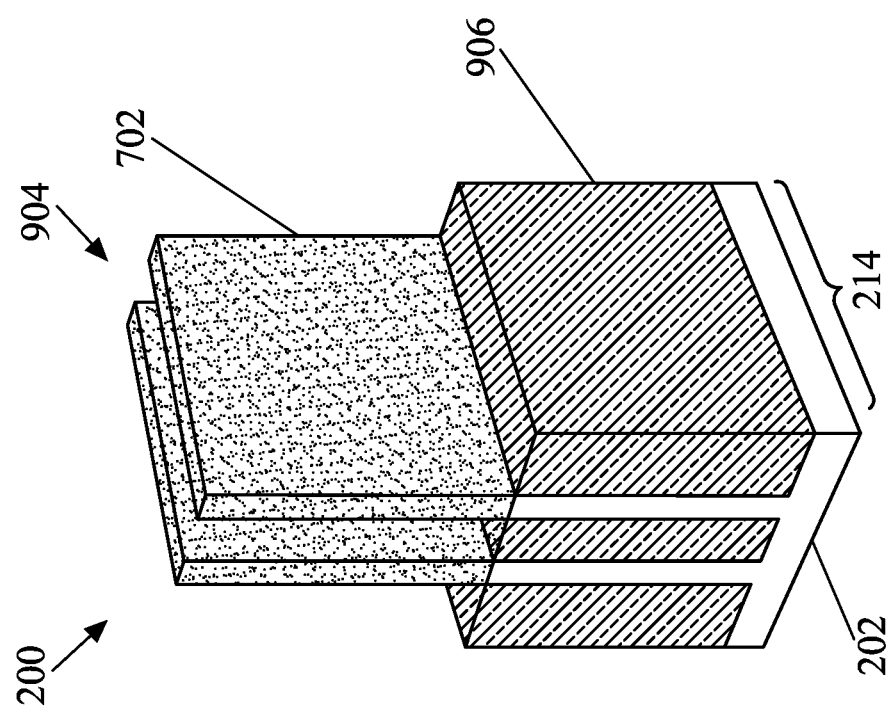
Figure 9B:
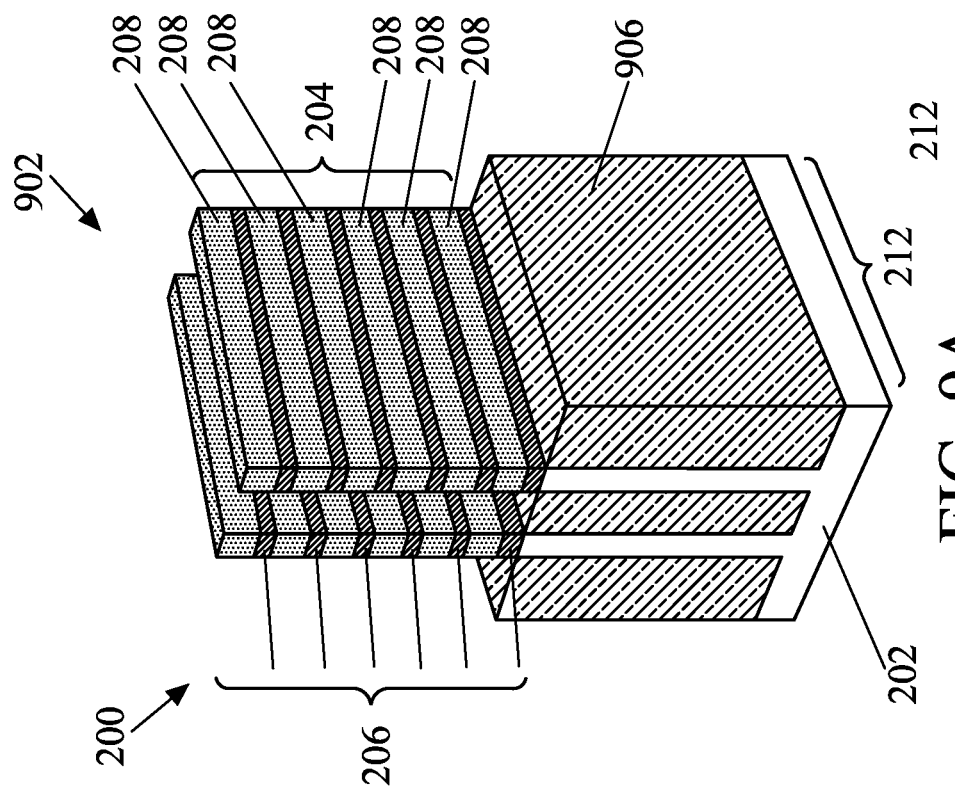

The method 100 then proceeds to block 116 where, in some embodiments, fin elements are patterned and formed. With reference to the example of FIGS. 9A/9B, in an embodiment of block 116, a plurality of fin elements 902, 904 extending from the substrate 202 are formed in first region 212 and second region 214 respectively (i.e., FIG. 9A illustrating first region 212 and FIG. 9B illustrating second region 214). In particular, a plurality of fin elements 902 are formed in the first region 212 (FIG. 9A), and a plurality of fin elements 904 are formed in the second region 214 (FIG. 9B). In various embodiments, each of the fin elements 902 includes a substrate portion formed from the substrate 202, and portions of each of the epitaxial layers of the epitaxial stack 204 including epitaxial layers 206 and 208. In some embodiments, each of the fin elements 904 includes a substrate portion formed from the substrate 202, and a portion of the epitaxial layer 702.

The fin elements 902 and 904 may be fabricated using suitable processes including photolithography and etch processes. The photolithography process may include forming a photoresist layer over the substrate 202 (e.g., over the semiconductor structure 200 of FIG. 8A/8B), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 202, and layers formed thereupon, while an etch process (i) forms trenches in unprotected regions through the epitaxial layers 206, 208 and into the substrate 202, in the first region 212, thereby leaving the plurality of extending fins 902, and (ii) forms trenches in unprotected regions through the epitaxial layer 702 and into the substrate 202, in the second region 214, thereby leaving the plurality of extending fin elements 904. The trenches may be etched using a dry etch (e.g., reactive ion etching), a wet etch, and/or other suitable processes. In various embodiments, the trenches may be filled with a dielectric material forming, for example, shallow trench isolation features interposing the fins.

In some embodiments, a dielectric material used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process. In some embodiments, the dielectric material (and subsequently formed STI features) may include a multi-layer structure, for example, having one or more liner layers.

In some embodiments of forming the isolation (STI) features, after deposition of the dielectric material, the deposited dielectric material is thinned and planarized, for example by a CMP process. The CMP process may planarize the top surface of the semiconductor structure 200 to form the STI features. In various embodiments, the STI features interposing the fin elements are then recessed. Referring to the example of FIGS. 9A and 9B, the STI features 906 are recessed such that the fin elements 902, 904 extend above the STI features 906. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fin elements 902, 904. In some embodiments, the height exposes each of the layers of the epitaxy stack 204 and substantially all of the epitaxial layer 702.

It is noted that FIGS. 9A/9B are illustrative of an embodiment of forming a GAA transistor in the first region 212 and a FinFET in the second region 214. However, other device types may alternatively or additionally be formed including those without "fin" based channel regions.

The method 100 then proceeds to block 118 where sacrificial layers/features are formed and in particular, (dummy) gate structures. While the present discussion is directed to a replacement gate (gate-last) process whereby a dummy gate structure is formed for a GAA device and a FinFET and subsequently replaced, other configurations may be possible.

With reference to FIGS. 10A/10B, in an embodiment of block 118, a (dummy) gate stack 1002 is formed over the fin elements 902 in the first region 212, and a (dummy) gate stack 1004 is formed over the fin elements 904 in the second region 214. In an embodiment, the gate stacks 1002, 1004 are sacrificial gate stacks that are subsequently removed as discussed below.

In some embodiments, prior to forming the gate stacks 1002, 1004, a dielectric layer 1006 may be formed. In some embodiments, the dielectric layer 1006 is deposited over the substrate 202 and over the fin elements 902, 904, including within trenches between adjacent fins 902, 904. In some embodiments, the dielectric layer 1006 may include $SiO_2$, silicon nitride, a high-K dielectric material or other suitable material. In various examples, the dielectric layer 1006 may be deposited by a CVD process, a subatmospheric CVD (SACVD) process, a flowable CVD process, an ALD process, a PVD process, or other suitable process. By way of example, the dielectric layer 1006 may be used to prevent damage to the fin elements 902, 904 by subsequent processing (e.g., subsequent formation of the dummy gate).

In some embodiments using a gate-last process, the gate stacks 1002, 1004 are dummy gate stacks and will be replaced by the final gate stack at a subsequent processing stage of the semiconductor structure 200. In particular, the gate stacks 1002, 1004 may be replaced at a later processing stage by a high-K dielectric layer (HK) and metal gate electrode (MG) that are similarly configured and disposed as the gate stacks 1002, 1004. The portion of the fin elements 902, 904 underlying the gate stacks 1002, 1004 may be referred to as the channel region. The gate stacks 1002, 1004 may also define a source/drain region of the fin elements 902, 904, for example, the regions of the fin elements adjacent to and on opposing sides of the channel region.

After formation of the gate stacks 1002, 1004, the method 100 may continue in block 120 to form additional features of the devices including as recognized in the art. The processes include, but are not limited to, forming spacer elements on sidewalls of the gate stacks, forming source/drain features adjacent the channel regions of each of fin elements 902, 904. In some embodiments, the source/drain features are formed by epitaxially growing a semiconductor material layer on the exposed fin elements 902, 904 in the source/drain regions. In further embodiments, the fin elements 902, 904 may be recessed in the source/drain regions prior to the growth of the source/drain features. After formation of source/drain features, in some embodiments, the method 100 includes forming an inter-layer dielectric (ILD) layer. Referring to the example of FIGS. 11A/11B, in an embodiment of block 120, an ILD layer 1102 is formed over the substrate 202. In some embodiments, a contact etch stop layer (CESL) is formed over the substrate 202 prior to forming the ILD layer 1102.

In some embodiments, the ILD layer 1102 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1102 may be deposited by a PECVD process or other suitable deposition technique. Referring to the example of FIGS. 11A/11B, illustrated are source/drain features 1104. It is noted that the source/drain features 1104 may be suitably doped to provide p-type or n-type transistors. For example, the GAA device of FIG. 11A may be one of p-type or n-type transistor and the FinFET device of FIG. 11B may be the same or different device type.

In some examples, after depositing the ILD (and/or CESL or other dielectric layers), a planarization process may be performed to expose a top surface of the gate stacks 1002, 1004. The method 100 may continue in block 120 to remove dummy gate stack (see block 118). In some cases, a dummy gate electrode (e.g., such as a polysilicon gate electrode) of the dummy gate stack may initially be removed from both the GAA device of first region 212 and the FinFET device of second region 214, by suitable etching processes.

Thereafter, in some examples and in an embodiment of block 120, a selective removal of the epitaxial layer(s) in the channel region of the GAA device in the first region 212 is provided. This is referred to as channel release. In embodiments, the selected epitaxial layer(s) are removed in the fin elements within the trench provided by the removal of the dummy gate electrode (e.g., the region of the fin on and over which the gate structure will be formed, or the channel region). For example, the epitaxy layers 206 are removed from the channel region of the substrate 202 and within the channel region. In some embodiments, the SiGe layers 206 are removed by a selective wet etching process. In some embodiments, the selective wet etching includes ammonia and/or ozone. As merely one example, the selective wet etching includes tetra-methyl ammonium hydroxide. (TMAH). The remaining Si layers 208 in the channel region of the fin 902 of the GAA device form the channel regions.

After release of the Si layers 208 in the channel region of the GAA device, the method 100 in block 120 may include formation of a final gate structure. The final gate structure may be a high-K/metal gate stack, however other compositions are possible. In some embodiments, the gate structure may form the gate associated with the multi-channels provided by the plurality of nanowires (Si layers 208, now having gaps there between) in the channel region of the GAA device of the first region 212. Similarly, a gate structure that may be a high-K/metal gate stack is formed over the channel provided by the epitaxial layer 702 in the channel region of the FinFET in second region 214.

Figures 11A, 11B:
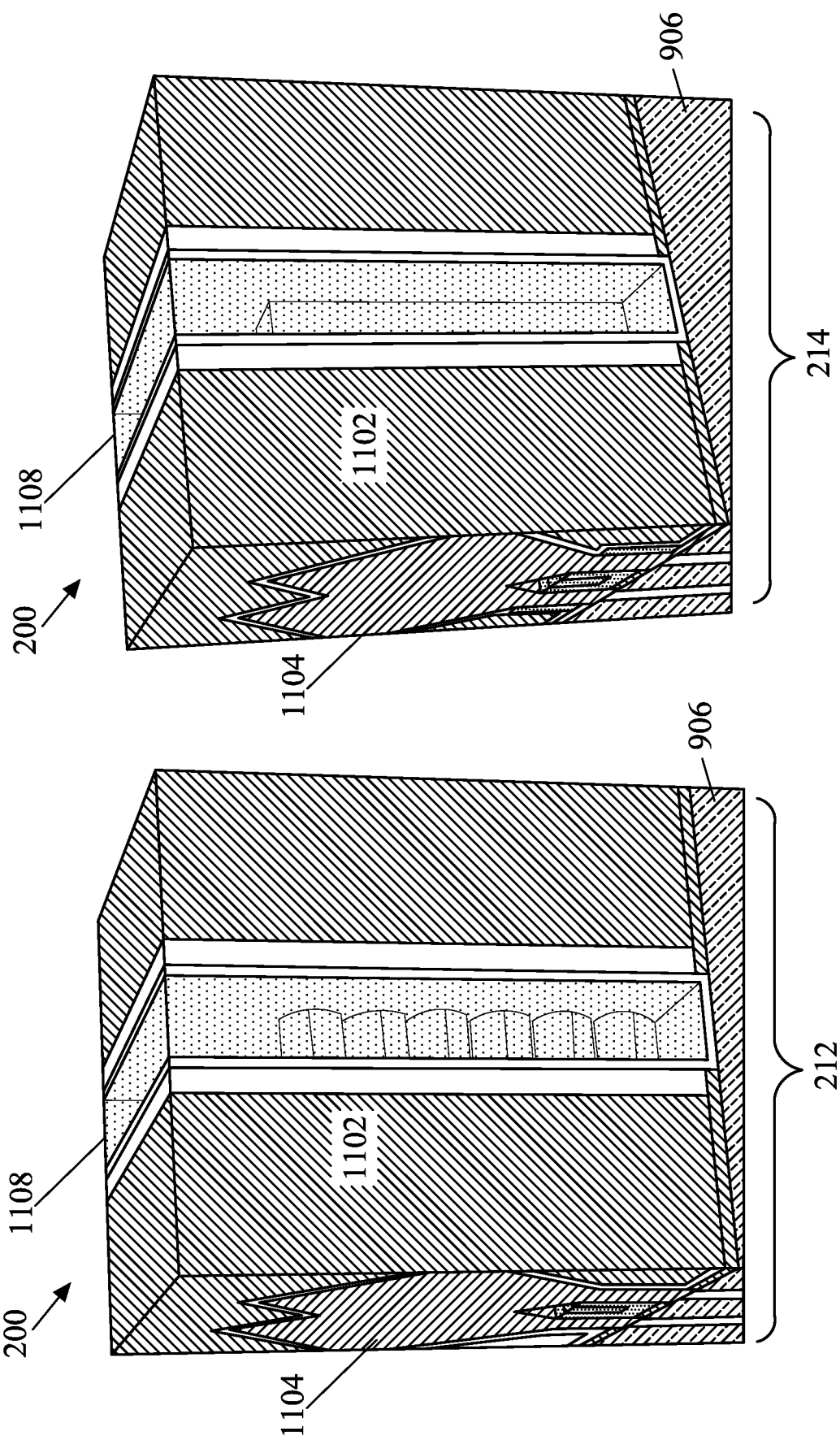
Figure 12:
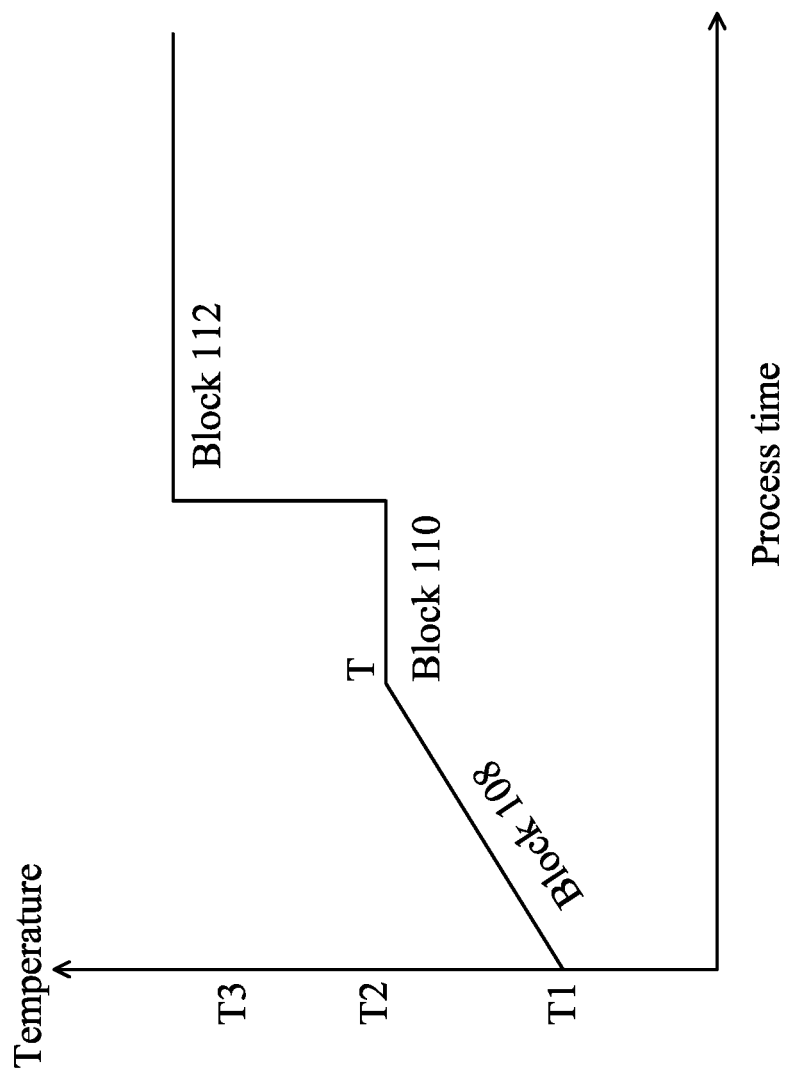
FIG. 12 is a graphical illustration of certain blocks of an embodiment the method of FIG. 1.

Referring to the example of FIGS. 11A/11B, in an embodiment of block 120, a gate dielectric is formed within the trench of the GAA device, in the first region 212, provided by the removal of the dummy gate and/or release of nanowires, described above. In various embodiments, the gate dielectric includes an interfacial layer (IL) and a high-K gate dielectric layer formed over the interfacial layer. High-K gate dielectrics, as used and described herein, include dielectric materials having a high dielectric constant, for example, greater than that of thermal silicon oxide (~3.9).

In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer may include a high-K dielectric layer such as hafnium oxide ($HfO_2$). Alternatively, the high-K gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), $Ba_7rO$, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

A metal gate 1108 also includes a metal layer is formed over the gate dielectric of the GAA device (in the first region 212) and over the gate dielectric of the FinFET device (in the second region 214). The metal layer may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the semiconductor device 200.

In some embodiments, the metal layer of the metal gate 1108 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer may include Ti, Ag, Al, TiAlN, TaC, TaCN, TaSiN, Mn, Zr, TiN, TaN, Ru, Mo, Al, WN, Cu, W, Re, Jr, Co, Ni, other suitable metal materials or a combination thereof. In various embodiments, the metal layer 1202 may be formed by ALD, PVD, CVD, e-beam evaporation, or other suitable process. Further, the metal layer may be formed separately for N-FET and P-FET transistors which may use different metal layers. The metal layer may provide an N-type or P-type work function, may serve as a transistor (e.g., GAA or FINFET device) gate electrode, and in at least some embodiments, the metal layer may include a polysilicon layer. With respect to the GAA device formed in the first region 212, the gate structure includes portions that interpose each of the Si layers 208, which each form channels of the GAA device.

The semiconductor device 200 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Thus, in some embodiments, the method 100 provides for reduced and/or eliminated Ge diffusion to adjacent silicon materials (e.g., substrate and silicon layers of the epitaxial stack). Without the reduction in Ge diffusion, Ge can diffuse to form a residue on adjacent Si materials. In particular the silicon materials (e.g., Si 208) that is becomes channel at GAA device can be adversely affected by this Ge contamination. For example, high temperatures including during EPI process can provide energy to Ge atom to overcome the diffusion barrier and in-cooperate on Si layers. Further, this Ge residue on silicon materials may oxidize to form GeOx at surface and degrade device performance. Thus, the present method provides for one or more steps that reduce this Ge diffusion risk including, for example, the passivation step (block 108) and/or the epitaxial liner layer step (block 110)

above, which may be implemented in combination or separately. As discussed above, block 110 may serve to insert a thinner Si layer (e.g., at a lower temperature) to avoid Ge diffusion and/or block 108 may provide a HCl treatment to passivate surfaces to reduce the presence of dangling bonds thereby avoiding the bonding of Ge to said dangling bonds.

Thus, one of the embodiments of the present disclosure described is a method of fabrication of a semiconductor structure. The method includes epitaxially growing a stack of layers alternating between a first composition and a second composition. The stack of layers extends across a first region and a second region of a semiconductor substrate. The method includes etching the stack of layers in the second region of the semiconductor substrate to form an opening. A passivation process is then performed that includes introducing chlorine to at least one surface of the opening. After performing the passivation process, an epitaxial liner layer is grown in the opening.

In a further embodiment, the method includes forming a channel of a gate all around (GAA) transistor using the stack of layers of the second composition in the first region of the semiconductor substrate. In an embodiment, epitaxially growing the stack of layers alternating between the first composition and the second composition includes epitaxially growing the first composition of epitaxial layers by growing a silicon germanium layer; and epitaxially growing the second composition of epitaxial layers by growing a silicon layer. In an embodiment, the method includes growing additional epitaxial material on the epitaxial liner layer. A fin may be formed of the additional epitaxial material, wherein the fin includes a channel region of a FinFET device in the second region of the semiconductor substrate. In an embodiment, growing the additional epitaxial material is performed a first temperature and the growing the epitaxial liner layer is performed at a second temperature. The second temperature may be less than the first temperature. In an embodiment, performing the passivation process includes introducing chlorine by bonding chlorine to the first composition of layers but not the second composition of layers. In an embodiment, performing the passivation process introducing chlorine includes bonding chlorine to the first composition of layers where the first composition is silicon. In a further embodiment, the second composition is silicon germanium. In some embodiments, the method also includes providing the opening exposing a surface of the semiconductor substrate in the second region. In some embodiments, performing the passivation process includes introducing chlorine to the exposed surface of the semiconductor substrate.

Another of the broader embodiments of methods discussed herein includes a method of fabricating a semiconductor device including forming a stack including a first silicon germanium (SiGe) layer and a second SiGe layer. A first silicon (Si) layer is formed interposing the first and second SiGe layers. A first region of the stack is etched including removing portions of each of the first Si layer, the first SiGe layer, and second SiGe layer to provide an opening having a first sidewall including the first SiGe layer, the first Si layer and the second Si layer. A passivation process is performed on the first sidewall to form a passivated sidewall. A silicon layer is epitaxially grown on the passivated sidewall.

In a further embodiment, the passivation process includes introducing hydrochloric (HCl) acid. In an embodiment, epitaxially growing the silicon layer during the method includes growing a first layer of silicon at a first temperature and growing a second layer of silicon at a second temperature, the second temperature greater than the first temperature. In an embodiment, the passivation process is performed at a third temperature less than the first and second temperatures. In an embodiment, the passivation process ramps from the third temperature to the first temperature during the passivation process.

In another of the broader methods discussed herein, a method includes growing an epitaxial stack of alternating silicon and silicon germanium layers on a substrate. An opening is etched in the epitaxial stack exposing a surface of the substrate. Hydrochloric acid (HCl) is introduced to the substrate having the etched opening. After introducing the HCl, a first portion of a silicon epitaxial material is grown in the opening at a first temperature and a second portion of the silicon epitaxial material is grown over the first portion at a second temperature greater than the first temperature.

In a further embodiment, the method includes using at least one of the first portion and the second portion of the silicon epitaxial material to form a fin of a FinFET device. In an embodiment, the silicon layers of epitaxial stack form a channel of a gate-all-around (GAA) device. In an embodiment, introducing HCl to the substrate having the etched opening bonds chlorine atoms to the surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method fabrication of a semiconductor structure, comprising:
providing a stack of layers alternating between a first composition and a second composition;
etching the stack of layers in a first region to form an opening in the stack of layers;
performing a passivation process introducing a chlorine containing gas to the opening; and
after performing the passivation process, growing an epitaxial liner layer in the opening.

2. The method of claim 1, wherein the chlorine containing gas includes hydrochloric acid (HCl).

3. The method of claim 2, wherein the chlorine containing gas further includes a carrier gas.

4. The method of claim 3, wherein the carrier gas includes hydrogen.

5. The method of claim 1, wherein the performing the passivation process includes attaching a chlorine atom to a dangling bond on at least one layer of the stack of layers.

6. The method of claim 5, wherein the attaching the chlorine atom includes bonding the chlorine atom to a silicon atom of the second composition.

7. The method of claim 5, wherein the performing the passivation process further includes etching sidewalls of the first composition.

8. The method of claim 5, wherein the growing the epitaxial liner layer includes detaching the chlorine atom from the at least one layer of the stack of layers.

9. The method of claim 1, further comprising:
forming a channel region of the semiconductor structure in at least one layer of the stack of layers.

10. The method of claim 1, wherein the providing the stack of layers includes:
forming the first composition of layers by providing silicon germanium layers; and
forming the second composition of layers by providing silicon layers.

11. The method of claim 1, wherein after performing the passivation process and before growing the epitaxial liner layer, a chlorine atom is bonded to a first region of a sidewall defining the opening, wherein the first region comprises the first composition and wherein a second region of the sidewall defining the opening is free of chlorine wherein the second region comprises the second composition.

12. A method of fabricating a semiconductor device, comprising:
forming a stack including a first silicon germanium (SiGe) layer and a second SiGe layer and a first silicon (Si) layer interposing the first and second SiGe layers;
providing a first sidewall including the first SiGe layer, the first Si layer and the second SiGe layer;
performing a passivation process on the first sidewall of the first Si layer to form a passivated sidewall of the first Si layer, wherein the first SiGe layer and the second SiGe layer are each free of the passivated sidewall; and
epitaxially growing a layer on the passivated sidewall of the first Si layer.

13. The method of claim 12, wherein the passivation process includes introducing hydrochloric (HCl) acid.

14. The method of claim 12, wherein the epitaxially growing the layer includes:
growing a first layer of silicon at a first temperature; and
growing a second layer of silicon at a second temperature, the second temperature greater than the first temperature.

15. The method of claim 12, wherein the passivated sidewall includes chlorine.

16. The method of claim 15, wherein the epitaxially growing the layer removes the chlorine.

17. A method, comprising:
providing an epitaxial stack of alternating silicon layers and silicon germanium layers on a substrate;
providing an exposed surface of the epitaxial stack extending above a surface of the substrate;
introducing a chlorine source to the substrate and the exposed surface of the epitaxial stack; and
after introducing the chlorine source, growing a first portion of a silicon epitaxial material on the exposed surface wherein the growing the first portion is performed at a first temperature and after growing the first portion, growing a second portion of silicon epitaxial material over the first portion, wherein the growing the second portion is performed at a second temperature greater than the first temperature.

18. The method of claim 17, further comprising:
wherein the chlorine source includes hydrogen and chlorine.

19. The method of claim 17, further comprising:
wherein the first portion of the silicon epitaxial material and the second portion of the silicon epitaxial material are at least a portion of a source/drain feature.

20. The method of claim 17, wherein the introducing the chlorine source bonds at least one chlorine atom to a portion of the exposed surface, wherein the portion of the exposed surface is a silicon layer of the epitaxial stack.

* * * * *